US012796503B2

(12) United States Patent
Lu et al.

(10) Patent No.: US 12,796,503 B2
(45) Date of Patent: Nov. 10, 2026

(54) BONDING STRUCTURES IN SEMICONDUCTOR PACKAGES

(71) Applicant: Apple Inc., Cupertino, CA (US)

(72) Inventors: Jiongxin Lu, San Jose, CA (US); Kunzhong Hu, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 545 days.

(21) Appl. No.: 18/348,925

(22) Filed: Jul. 7, 2023

(65) Prior Publication Data

US 2025/0015027 A1 Jan. 9, 2025

(51) Int. Cl.

| | |
|---|---|
| ***H10W 70/65*** | (2026.01) |
| ***H10W 70/05*** | (2026.01) |
| ***H10W 72/00*** | (2026.01) |
| ***H10W 72/90*** | (2026.01) |
| ***H10W 80/00*** | (2026.01) |
| ***H10W 90/00*** | (2026.01) |

(52) U.S. Cl.

CPC ......... *H10W 70/65* (2026.01); *H10W 70/093* (2026.01); *H10W 72/019* (2026.01); *H10W 72/01955* (2026.01); *H10W 72/921* (2026.01); *H10W 72/931* (2026.01); *H10W 80/312* (2026.01); *H10W 80/327* (2026.01); *H10W 90/794* (2026.01)

(58) Field of Classification Search

None

See application file for complete search history.

(56) References Cited

U.S. PATENT DOCUMENTS

| | | | |
|---|---|---|---|
| 5,969,417 | A | 10/1999 | Yamashita et al. |
| 7,067,918 | B2 | 6/2006 | Murata et al. |
| 10,418,350 | B2 | 9/2019 | Das et al. |
| 10,515,917 | B2 | 12/2019 | Chuang et al. |
| 10,937,762 | B2 | 3/2021 | Lin et al. |
| 10,943,883 | B1 | 3/2021 | Bonam et al. |

(Continued)

FOREIGN PATENT DOCUMENTS

| | | | |
|---|---|---|---|
| CN | 118712179 A * | 9/2024 | ........... H01L 23/481 |
| CN | 120015739 A * | 5/2025 | ............. H01L 21/56 |

(Continued)

OTHER PUBLICATIONS

International Search Report and Written Opinion directed to related International Application No. PCT/US2024/036143, mailed Oct. 18, 2024; 7 pages.

*Primary Examiner* — Michael Lebentritt

(74) *Attorney, Agent, or Firm* — Sterne, Kessler, Goldstein & Fox P.L.L.C.

(57) ABSTRACT

Various embodiments of an integrated circuit (IC) die package are disclosed. An IC die package includes an IC die, an interposer structure electrically connected to the IC die, a first bonding structure, and a second bonding structure. The first bonding structure includes a first dielectric layer disposed on the IC die and also includes a first conductive pad having an embedded portion disposed in the first dielectric layer and an anchor portion extending over a top surface of the first dielectric layer. The second bonding structure includes a second dielectric layer disposed on the interposer structure, a second conductive pad disposed in the second dielectric layer, and an anchor layer surrounding the anchor portion.

20 Claims, 19 Drawing Sheets

(56) References Cited

U.S. PATENT DOCUMENTS

| | | | |
|---|---|---|---|
| 11,233,035 B2 | 1/2022 | Chen et al. | |
| 11,538,778 B2 | 12/2022 | Fang | |
| 11,637,056 B2 | 4/2023 | Lin et al. | |
| 2013/0087365 A1 | 4/2013 | Weatherspoon et al. | |
| 2018/0226377 A1 | 8/2018 | Geissler et al. | |
| 2020/0075556 A1 | 3/2020 | Chen et al. | |
| 2020/0251397 A1* | 8/2020 | Lai | H01L 23/32 |
| 2021/0091056 A1 | 3/2021 | Yu et al. | |
| 2021/0118805 A1* | 4/2021 | Sio | H01L 23/481 |
| 2022/0399294 A1 | 12/2022 | Dogiamis et al. | |
| 2023/0050652 A1 | 2/2023 | Moon et al. | |
| 2023/0068578 A1 | 3/2023 | Yu et al. | |
| 2023/0163089 A1 | 5/2023 | Kim et al. | |
| 2023/0207474 A1 | 6/2023 | Uzoh et al. | |
| 2024/0234354 A1* | 7/2024 | Tong | H01L 24/16 |
| 2024/0282686 A1 | 8/2024 | Liu et al. | |
| 2025/0112176 A1* | 4/2025 | Lu | H01L 23/562 |
| 2025/0125273 A1* | 4/2025 | Lin | H01L 25/0652 |
| 2025/0233054 A1* | 7/2025 | Chang | H01L 23/585 |

FOREIGN PATENT DOCUMENTS

| | | | |
|---|---|---|---|
| TW | 202322332 A | | 6/2023 |
| TW | 202335216 A | | 9/2023 |
| TW | 202435386 A | | 9/2024 |
| TW | 202531529 A | * | 8/2025 |
| TW | I894331 B | * | 8/2025 |

* cited by examiner

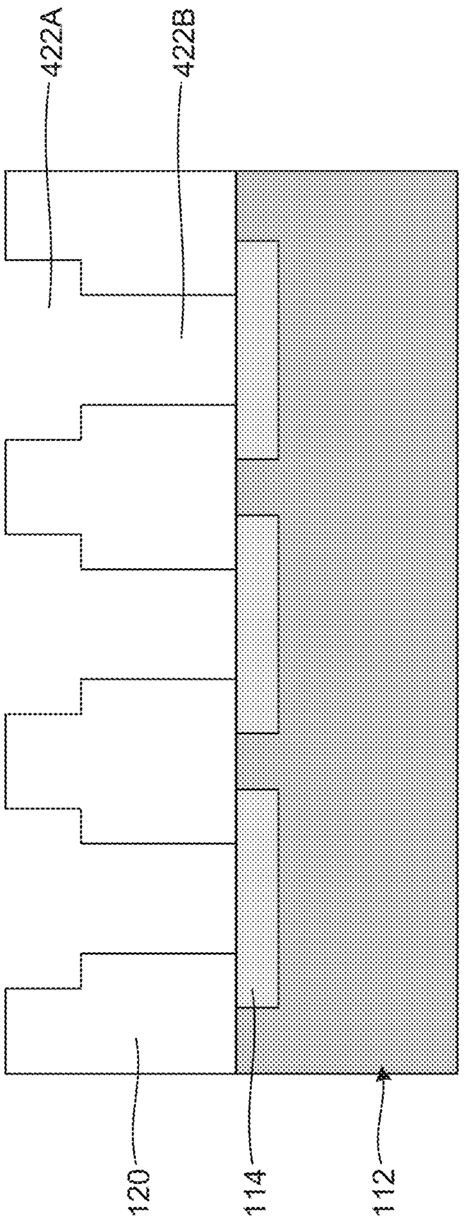
FIG. 4
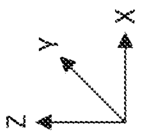

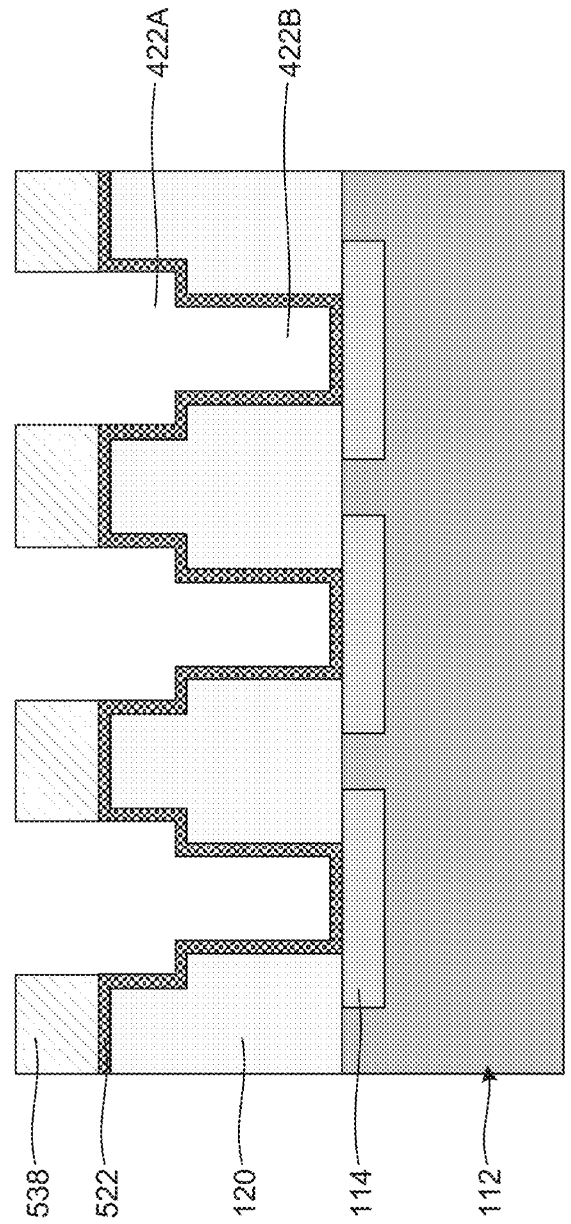
FIG. 5
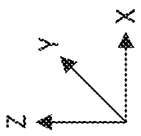

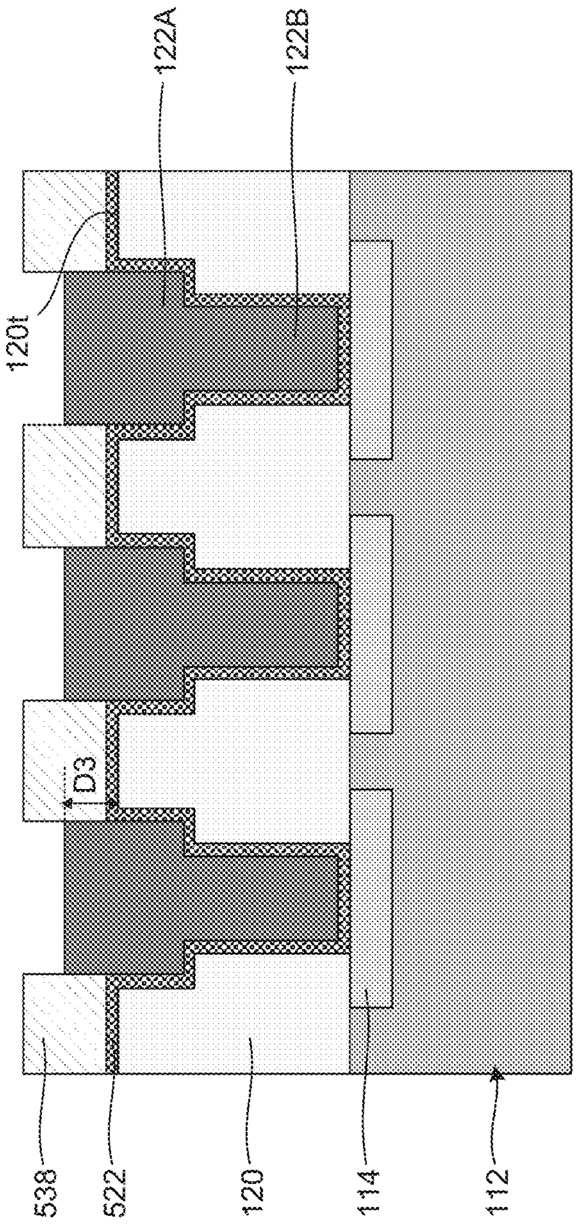
FIG. 6
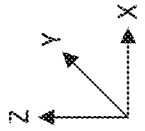

BONDING STRUCTURES IN SEMICONDUCTOR PACKAGES

FIELD

This disclosure relates to semiconductor packages and, more particularly, to bonding structures in integrated circuit (IC) die packages.

BACKGROUND

An IC die package can include two or more IC dies (e.g., system-on-chips (SOCs), logic dies, and/or memory dies) mounted on a package substrate. Power and signal connections between the IC dies can be made through a routing layer. The two or more IC dies can be bonded to the routing layer through hybrid bonding structures. The complexity of manufacturing reliable bonds between the hybrid bonding structures has increased with the scaling down of IC die packages to meet the increased demand for portable electronic devices.

SUMMARY

Various embodiments of bonding structures in an IC die package are disclosed. In some embodiments, a structure includes an IC die, an interposer structure electrically connected to the IC die, a first bonding structure, and a second bonding structure. The first bonding structure includes a first dielectric layer disposed on the IC die and also includes a first conductive pad having an embedded portion disposed in the first dielectric layer and an anchor portion extending over a top surface of the first dielectric layer. The second bonding structure includes a second dielectric layer disposed on the interposer structure, a second conductive pad disposed in the second dielectric layer, and an anchor layer surrounding the anchor portion.

In some embodiments, an IC die package includes a routing layer, a die layer, and a bonding layer disposed between the routing layer and the die layer. The routing layer includes conductive lines and vias, and the die layer includes IC dies disposed on the routing layer. The bonding layer includes a bottom dielectric layer disposed on the routing layer, a top dielectric disposed on and bonded to the bottom dielectric layer, a bottom conductive structure disposed in the bottom dielectric layer, and a top conductive structure having a first portion disposed in the top dielectric layer and a second portion disposed in the bottom conductive structure.

In some embodiments, a method for fabricating an IC die package with hybrid bonding structures includes forming a first opening in a first dielectric layer on an integrated circuit (IC) die, depositing a first conductive layer with a first layer portion in the first opening and a second layer portion extending over a top surface of the first dielectric layer, forming a second opening in a second dielectric layer on an interposer structure, depositing a second conductive layer in the second opening, and depositing a third conductive layer on the second conductive layer, such that a top surface of the third conductive layer is below a top surface of the second dielectric layer. The method further includes placing the top surface of the first dielectric layer on the top surface of the second dielectric layer to position the second layer portion in the second opening and on the third conductive layer and performing a bonding process to bond the second layer portion and the third conductive layer.

BRIEF DESCRIPTION OF THE DRAWINGS

Aspects of this disclosure are best understood from the following detailed description when read with the accompanying figures.

FIGS. 4-15 illustrate cross-sectional views of an IC die package at various stages of its fabrication process, in accordance with some embodiments.

Figure 1A:
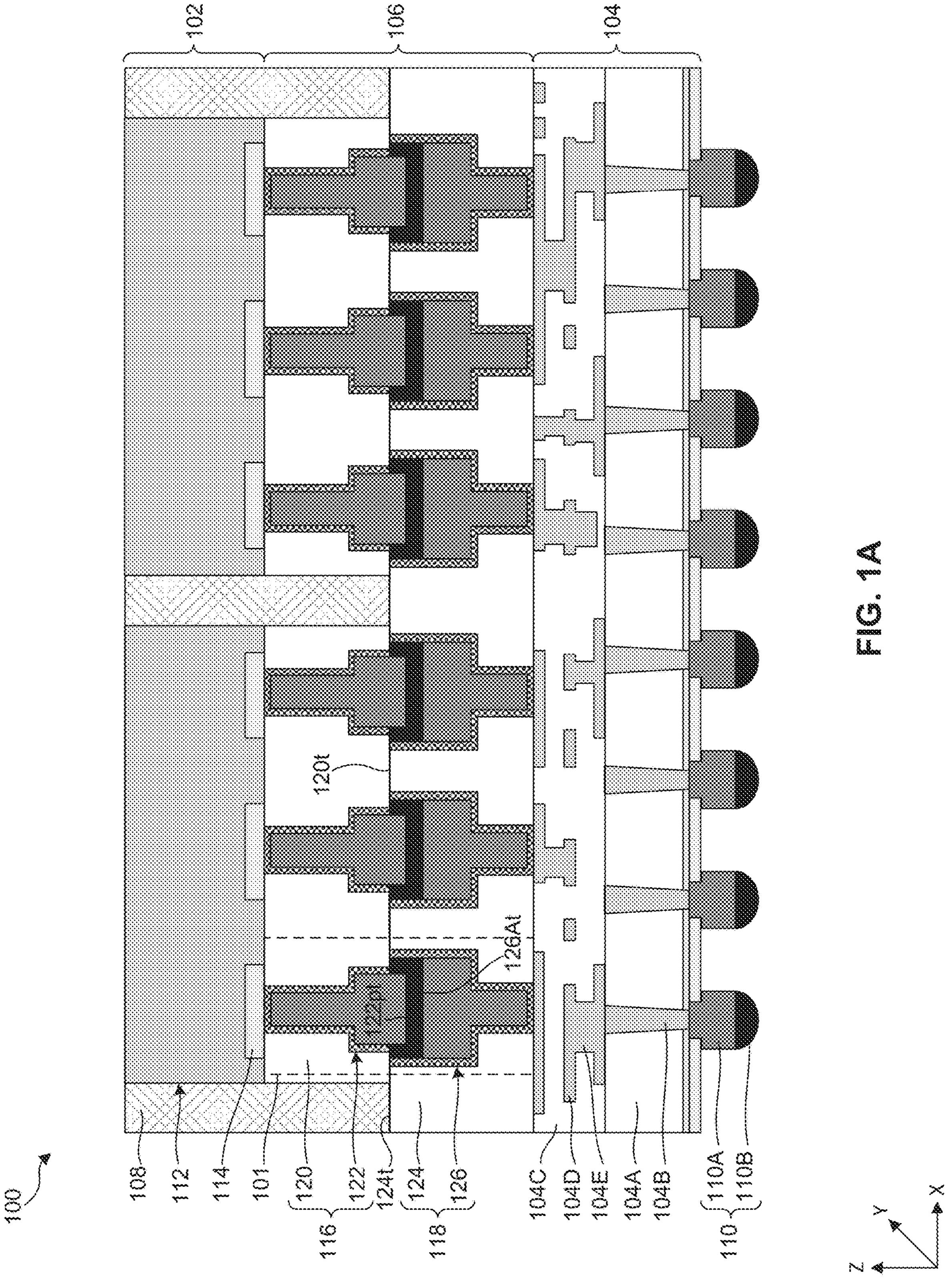
FIG. 1A illustrates a cross-sectional view of an IC die package with hybrid bonding structures, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., +1%, +2%, +3%, +4%, +5% of the value). These values are merely examples and are not intended to be limiting. The terms "about" and "substantially" can refer to a percentage of the values as interpreted by those skilled in relevant art(s) in light of the teachings herein.

An IC die (also referred to as an "IC chip") can include a compilation of layers with different functionality, such as interconnect structures, power distribution network, logic chips, memory chips, and the like. An IC die package (also referred to as "semiconductor package") can include multiple IC dies disposed on and electrically connected to routing layers having interposer structures, which can be disposed on and electrically connected to a package substrate. The routing layers and package substrate can provide electrical connections (also referred to as "signal transmission paths" or "metal routings") between IC dies on the same routing layer and/or between IC dies on different routing layers.

The IC die can be bonded to the routing layer through top and bottom hybrid bonding structures in a hybrid bonding process. The top hybrid bonding structure can be disposed on and electrically connected to interconnect structures of the IC die. The bottom hybrid bonding structure can be disposed on and electrically connected to metal lines in the routing layer. Each of the top and bottom hybrid bonding structures can include a dielectric layer and conductive structures disposed in the dielectric layer. The top surfaces (also referred to as "bonding surfaces") of the top and bottom hybrid bonding structures to be bonded can be brought in contact during the hybrid bonding process to form fusion bonds between the dielectric layers (e.g., oxide-to-oxide bonds) and between the conductive structures (e.g., metal-to-metal bonds).

One of the challenges of manufacturing strong and reliable bonds between the top and bottom hybrid bonding structures is achieving surface planarity of the bonding surfaces of the conductive structures without compromising the cost of fabricating the IC die packages. Inadequate planarization of the bonding surfaces of the conductive structures can result in weak fusion bonds between the conductive structures. The presence of weak fusion bonds can lead to delamination of the top and bottom hybrid bonding structures at the edges or other locations of the IC dies. Another challenge is preserving the reliability and integrity of the fusion bonds between the dielectric layers and of the elements of the IC dies during the high temperature anneal process performed in the hybrid bonding process. The high temperature anneal process can be performed for diffusing the conductive structures into each other at the bonding interfaces to form the metal-to-metal bonds.

To address the abovementioned challenges, the present disclosure provides example top and bottom hybrid bonding structures in IC die packages with stronger bonds, better manufacturing process control, and reduced susceptibility to delamination. The present disclosure also provides methods of forming the top and bottom hybrid bonding structures with shorter planarization process times and lower bonding process temperatures. In some embodiments, the top hybrid bonding structure can include a first dielectric layer and a first conductive structure disposed in the first dielectric layer. The first conductive structure can include a first pad with an anchor portion that protrudes over a top surface of the first dielectric layer. In some embodiments, the bottom hybrid bonding structure can include a second dielectric layer and a second conductive structure disposed in the second dielectric layer. The second conductive structure can include a second pad and an anchor layer disposed on the second pad.

The anchor layer of the second conductive structure can surround and bond with the anchor portion of the first conductive structure. The material of the anchor layer can promote stronger bonds between the first and second conductive structures compared to bonds formed between first and second conductive structures in other hybrid bonding structures without the anchor layers. In addition, the material of the anchor layer can promote the bonding of the first and second conductive structures through the anchor layer at lower bonding process temperatures than that used in direct bonding of first and second conductive structures in other hybrid bonding structures without the anchor layers. In some embodiments, the anchor layer can include a metallic layer with a material having a melting temperature lower than that of the metallic materials of the first and second pads. The anchor layer can further include an intermetallic compound (IMC) layer (also referred to as a "metal alloy layer") formed between the metallic layer of the anchor layer and the anchor portion of the first pad. The IMC layer can include a combination of the materials of the first pad and the metallic layer and have a melting temperature higher than that of the materials of the first and second pads.

FIG. 1A illustrates a cross-sectional view of an IC die package 100 (also referred to as an "IC chip package 100"), according to some embodiments. FIGS. 1B-1E illustrate different enlarged cross-sectional views of region 101 of FIG. 1A. FIGS. 1B-1E illustrate cross-sectional views of region 101 with additional structures that are not shown in FIG. 1A for simplicity. The discussion of elements in FIGS. 1A-1E with the same annotations applies to each other, unless mentioned otherwise.

Referring to FIG. 1A, in some embodiments, IC die package 100 can include (i) a die layer 102, (ii) a routing layer or a bridge layer 104, (iii) a bonding layer 106, (iv) an encapsulation layer 108, and (v) conductive bonding structures 110. In some embodiments, die layer 102 can include one or more IC dies 112, each of which can include a high-performance IC die, such as a SoC die, a micro control unit (MCU) die, a microprocessor unit (MPU) die, an accelerated processing unit (APU) die, a central processing unit (CPU) die, a graphics processing unit (GPU) die, and a combination thereof. Though two IC dies 112 are shown in die layer 102, any number of IC dies 112 can be included in die layer 102. In some embodiments, IC die 112 can include interconnect structures 114, which can electrically connect devices (not shown) in IC die 112 to underlying routing layer 104 through bonding layer 106. In some embodiments, IC dies 112 can be electrically connected to each other through bonding layer 106 and routing layer 104. In some embodiments, die layer 102 can be electrically connected to overlying die layers or other elements (not shown) of IC die package 100 through a redistribution layer (not shown) or a bonding layer similar to bonding layer 106. In some embodiments, each of IC dies 112 can be surrounded by encapsulation layer 108 including a molding compound, an epoxy, a resin, or any other suitable encapsulation material.

In some embodiments, routing layer 104 can include an interposer structure having (i) a semiconductor substrate 104A, (ii) conductive through-vias 104B disposed in semiconductor substrate 104A, (iii) a dielectric layer 104C disposed on semiconductor substrate 104A, (iv) metal lines 104D disposed in dielectric layer 104C, and (v) metal vias 104E disposed in dielectric layer 104C. In some embodiments, semiconductor substrate 104A can include a silicon substrate. In some embodiments, conductive through-vias 104B can include a metal (such as copper and aluminum), a metal alloy (such as copper alloy and aluminum alloy), or a combination thereof. In some embodiments, dielectric layer 104C can include a stack of dielectric layers. In some embodiments, routing layer 104 can be electrically bonded to an underlying package substrate (not shown) through conductive bonding structures 110. In some embodiments, each of conductive bonding structures 110 can include copper (Cu) bumps 110A and solder bumps 110B. The package substrate can be disposed on and electrically connected to a circuit board (not shown) and can electrically connect IC die package 100 to external devices through the circuit board.

Figure 1B:
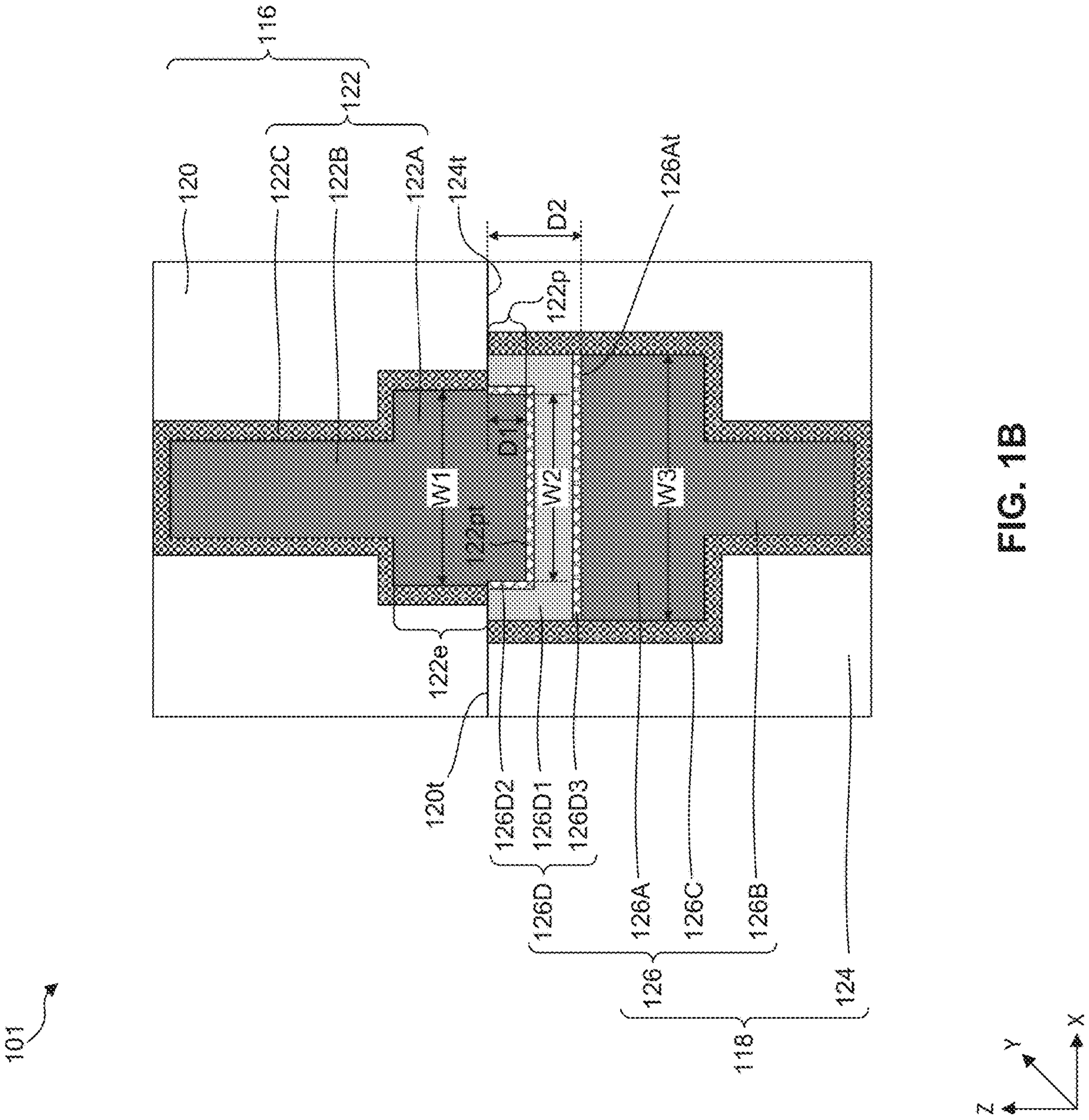
FIGS. 1B-1E illustrate different cross-sectional views of hybrid bonding structures in an IC die package, in accordance with some embodiments.

Referring to FIGS. 1A and 1B, in some embodiments, bonding layer 106 can include one or more first hybrid bonding structures 116 (also referred to as a "top hybrid bonding structures 116") and a second hybrid bonding structure 118 (also referred to as a "bottom hybrid bonding structure 118"). A bottom surface of each first hybrid bonding structure 116 can be disposed on and electrically connected to interconnect structures 114 of a corresponding IC die 112. A top surface (also referred to as a "bonding surface") of each first hybrid bonding structure 116 can be disposed on and bonded to second hybrid bonding structure 118 through hybrid bonds, as described in detail below. In some embodiments, each first hybrid bonding structure 116 can include a first dielectric layer 120 and one or more first conductive structures 122 disposed in first dielectric layer 120. Though three first conductive structures 122 are shown in each first hybrid bonding structure 116, any number of first conductive structures 122 can be included in first hybrid bonding structure 116. In some embodiments, first dielectric layers 120 can include silicon oxide ($SiO_2$), silicon nitride (SiN), silicon carbide (SiC), silicon oxynitride (SiON), silicon carbon nitride (SiCN), or any other suitable dielectric material.

The following discussion of first conductive structure 122 in region 101 applies to other first conductive structures 122 of FIG. 1A, unless mentioned otherwise. In some embodiments, first conductive structure 122 can include a first pad 122A, a first via 122B, and a first liner 122C. First pad 122A can include an anchor portion 122*p* and an embedded portion 122*e*. Anchor portion 122*p* can protrude over a top surface 120*t* of first dielectric layer 120 and can be embedded in second hybrid bonding structure 118. With the use of anchor portion 122*p*, stronger hybrid bonds between first and second hybrid bonding structures 116 and 118 can be formed with shorter processing times to reduce manufacturing costs and prevent delamination between the hybrid bonds, as described in detail below. In some embodiments, anchor portion 122*p* can protrude a distance D1 of about 500 nm to about 2000 nm over top surface 120*t* of first dielectric layer 120. Within this range of distance D1, stronger hybrid bonds can be adequately formed without compromising the manufacturing cost of IC die package 100.

Embedded portion 122*e* can be disposed in first dielectric layer 120 and in contact with first via 122B. In some embodiments, embedded portion 122*e* can have a width W1 greater than a width W2 of anchor portion 122*p*. In some embodiments, embedded portion 122*e* and first via 122B can be surrounded by first liner 122C and anchor portion 122*p* can be liner-free. A top surface of first liner 122C can be substantially coplanar with top surface 120*t* of first dielectric layer 120. In some embodiments, first pad 122A and first via 122B can include the same conductive material, such as copper (Cu), cobalt (Co), aluminum (Al), any other suitable conductive material, and a combination thereof. In some embodiments, first liner 122C can include a conductive material the same as or different from the material of first pad 122A and first via 122B. In some embodiments, first liner 122C can include titanium (Ti), Cu, or other suitable conductive material.

In some embodiments, second hybrid bonding structure 118 can include a second dielectric layer 124 and one or more second conductive structures 126 disposed in second dielectric layer 124. Though six second conductive structures 126 are shown in second hybrid bonding structure 118, any number of second conductive structures 126 can be included in second hybrid bonding structure 116. In some embodiments, second dielectric layer 124 can include a dielectric material the same as or different from first dielectric layer 120. First and second dielectric layers 120 and 124 can be bonded to each other through dielectric-to-dielectric fusion bonds, and first and second conductive structures 122 and 126 can be bonded to each other through metal-to-metal fusion bonds or solder bonds, as described in detail below. In some embodiments, the number of second conductive structures 126 can be equal to the total number of first conductive structures 122. Each second conductive structure 126 can be bonded to a corresponding one of first conductive structures 122.

The following discussion of second conductive structure 126 in region 101 applies to other second conductive structures 126 of FIG. 1A, unless mentioned otherwise. In some embodiments, second conductive structure 126 can include a second pad 126A, a second via 126B, a second liner 126C, and an anchor layer 126D (also referred to as a "glue layer 126D" or a "solder layer 126D"). In some embodiments, second pad 126A, second via 126B, and second liner 126C can include conductive materials the same as or different from first pad 122A, first via 122B, and first liner 122C, respectively. In some embodiments, second liner 126C can surround second pad 126A, second via 126B, and anchor layer 126D. A top surface of second liner 126C can be substantially coplanar with a top surface 124*t* of second dielectric layer 124. On the other hand, top surface 126At of second pad 126A can be non-coplanar with and below the top surface of second liner 126C and/or top surface 124*t* of second dielectric layer 124. In some embodiments, top surface 126At of second pad 126A can be a distance D2 of about 1 μm to about 2 μm below the top surface of second liner 126C and/or top surface 124*t* of second dielectric layer 124. In some embodiments, a width W3 of second pad 126A can be greater than widths W1 and W2 of first pad 122A to provide a greater tolerance for misalignment between first pad 122A and second pad 126A during hybrid bonding of first and second hybrid bonding structures 116 and 118, as described in detail below.

Anchor layer 126D can be disposed between first pad 122A and second pad 126A. A first side of anchor layer 126D can surround anchor portion 122*p* of first pad 122 and can be fusion or solder bonded to top surface 122*pt* and side surfaces of anchor portion 122*p*. A second side of anchor layer 126D can be fusion or solder bonded to top surface 126At of second pad 126A. The material of anchor layer 126D in addition to anchor portion 122*p* being enclosed by anchor layer 126D can promote stronger bonding and reduced delamination between first and second conductive structures 122 and 126 compared to that between first and second conductive structures in other hybrid bonding structures without anchor layer 126D and/or anchor portions 122*p*. As electrical connections between the elements of IC dies 112 and routing layer 104 can be made through first and second conductive structures 122 and 126, stronger bonds with reduced susceptibility to delamination between first and second conductive structures 122 and 126 increases reliability of IC die package 100. In addition, the material of anchor layer 126D can promote the bonding of first and second conductive structures 122 and 126 through anchor layer 126D at lower bonding process temperatures than that used in direct bonding of first and second conductive structures in other hybrid bonding structures without anchor layer 126D, as described in detail below.

Referring to FIG. 1B, in some embodiments, anchor layer 126D can include (i) a metal layer 126D1, (ii) a first intermetallic compound (IMC) layer 126D2, and (iii) a second IMC layer 126D3. In some embodiments, metal layer 126D1 can include a metal, such as tin (Sn), indium (In), and any other suitable metal having a melting temperature lower than that of the materials of first pad 122A and second pad 126A. In some embodiments, first IMC layer 126D2 can be formed at an interface between first pad 122A and metal layer 126D1 and can include an IMC (also referred to as a "metal alloy") having a melting temperature higher than that of the materials of first pad 122A and metal layer 126D1. The IMC of first IMC layer 126D2 can include a combination of the materials of first pad 122A and metal layer 126D1. In some embodiments, first IMC layer 126D2 can include Cu and Sn when first pad 122A includes Cu and metal layer 126D1 includes Sn.

In some embodiments, second IMC layer 126D3 can be formed at an interface between second pad 126A and metal layer 126D1 and can include an IMC having a melting temperature higher than that of the materials of second pad 126A and metal layer 126D1. The IMC of second IMC layer 126D3 can include a combination of the materials of second pad 126A and metal layer 126D1. In some embodiments, second IMC layer 126D3 can include Cu and Sn when second pad 126A includes Cu and metal layer 126D1 includes Sn. In some embodiments, the IMCs of first and second IMC layers 126D2 and 126D3 can be the same as each other when the materials of first and second pads 122A and 126A are the same. In some embodiments, the IMCs of first and second IMC layers 126D2 and 126D3 can be different from each other when the materials of first and second pads 122A and 126A are different from each other. The IMCs of first and second IMC layers 126D2 and 126D3 can provide stronger bonding between first and second pads 122A and 126A compared to first and second conductive structures bonded directly to each other without IMCs.

Figure 1C:
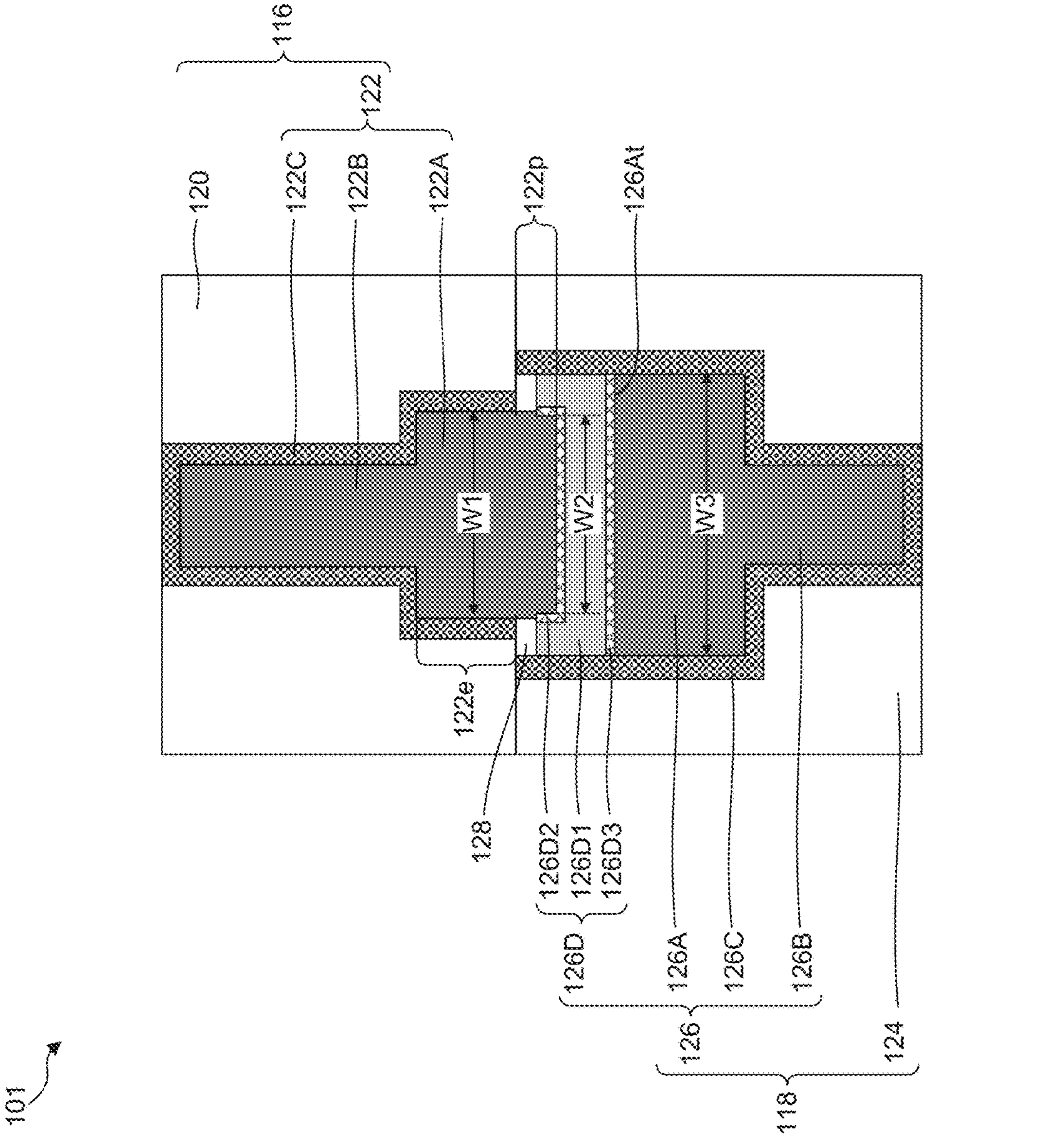

Referring to FIG. 1C, in some embodiments, sidewalls of anchor portion 122*p* may not be completely covered by anchor layer 126D, unlike the structure of FIG. 1B. As a result, there can be an air gap 128 surrounding anchor portion 122*p* and between anchor layer 126D and first conductive structure 122.

Figure 1D:
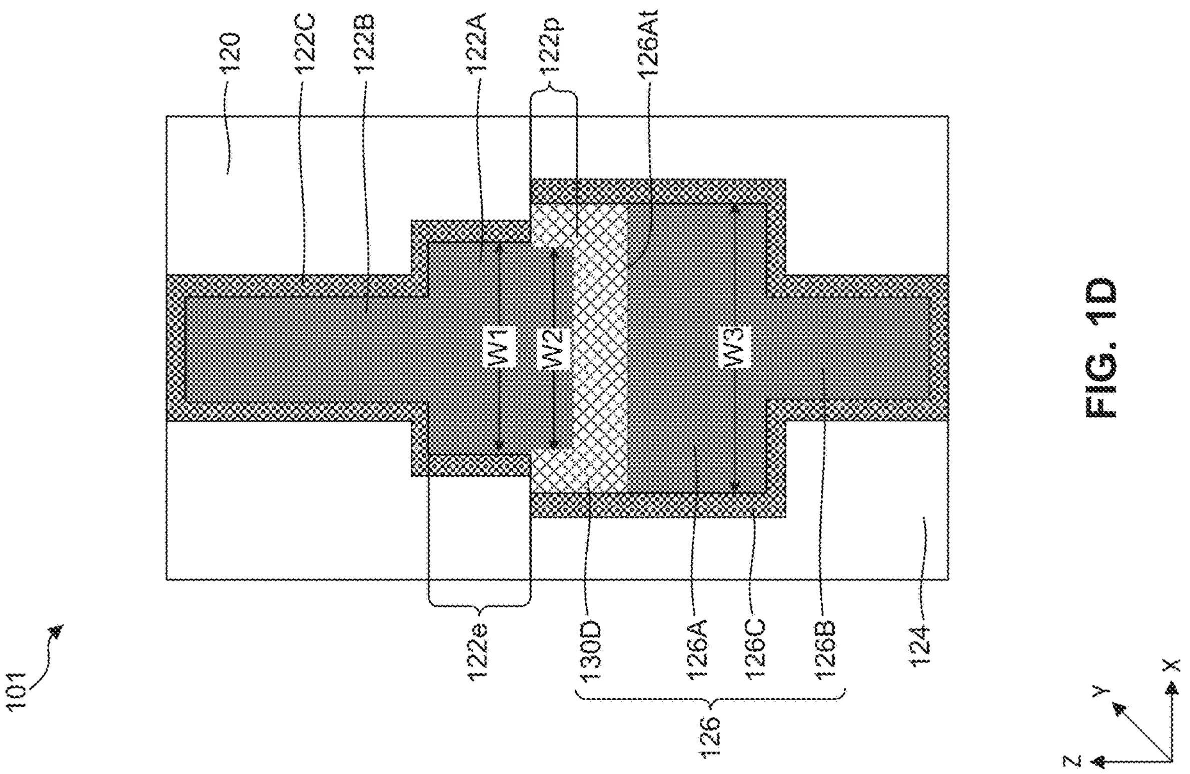

Referring to FIG. 1D, in some embodiments, instead of anchor layer 126D, second conductive structure 126 can include anchor layer 130. The discussion of anchor layer 126D applies to anchor layer 130, unless mentioned otherwise. Anchor layer 130 can be disposed between first pad 122A and second pad 126A. A first side of anchor layer 130 can surround anchor portion 122*p* of first pad 122 and can be bonded to top surface 122*pt* and side surfaces of anchor portion 122*p*. A second side of anchor layer 130 can be bonded to top surface 126At of second pad 126A. In some embodiments, anchor layer 130 can include an IMC having a melting temperature higher than that of the materials of first pad 122A and second pad 126A. In some embodiments, the IMC of anchor layer 130 can include a combination of the materials of first pad 122A and second pad 126A and Sn or In. In some embodiments, the IMC of anchor layer 130 can include Cu and Sn when both first pad 122A and second pad 126A include Cu.

Figure 1E:
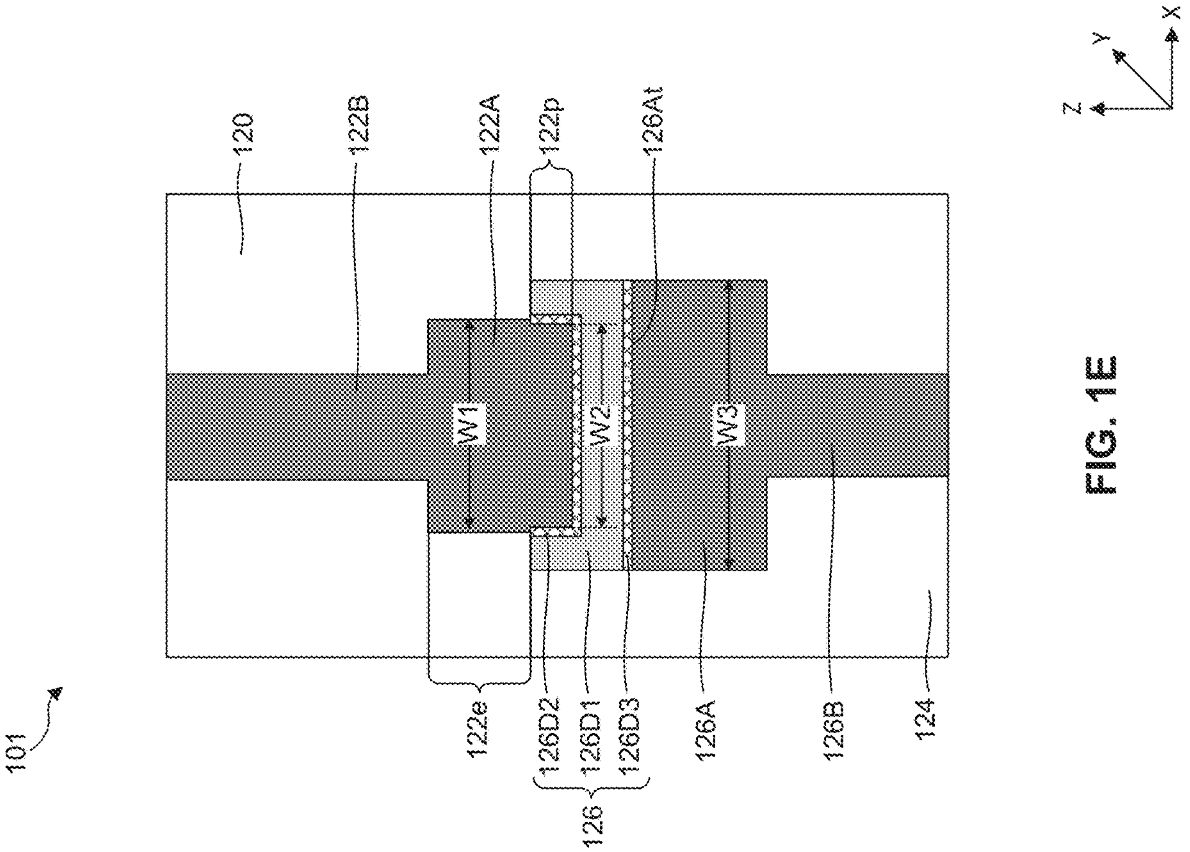

Referring to FIG. 1E, in some embodiments, first conductive structure 122 does not include first liner 122C, and embedded portion 122*e* of first pad 122A and first via 122B can be in direct contact with first dielectric layer 120. Similarly, second conductive structure 126 does not include second liner 126C, and second pad 126A, second via 126B, and anchor layer 126D can be in direct contact with second dielectric layer 124.

Figure 2:
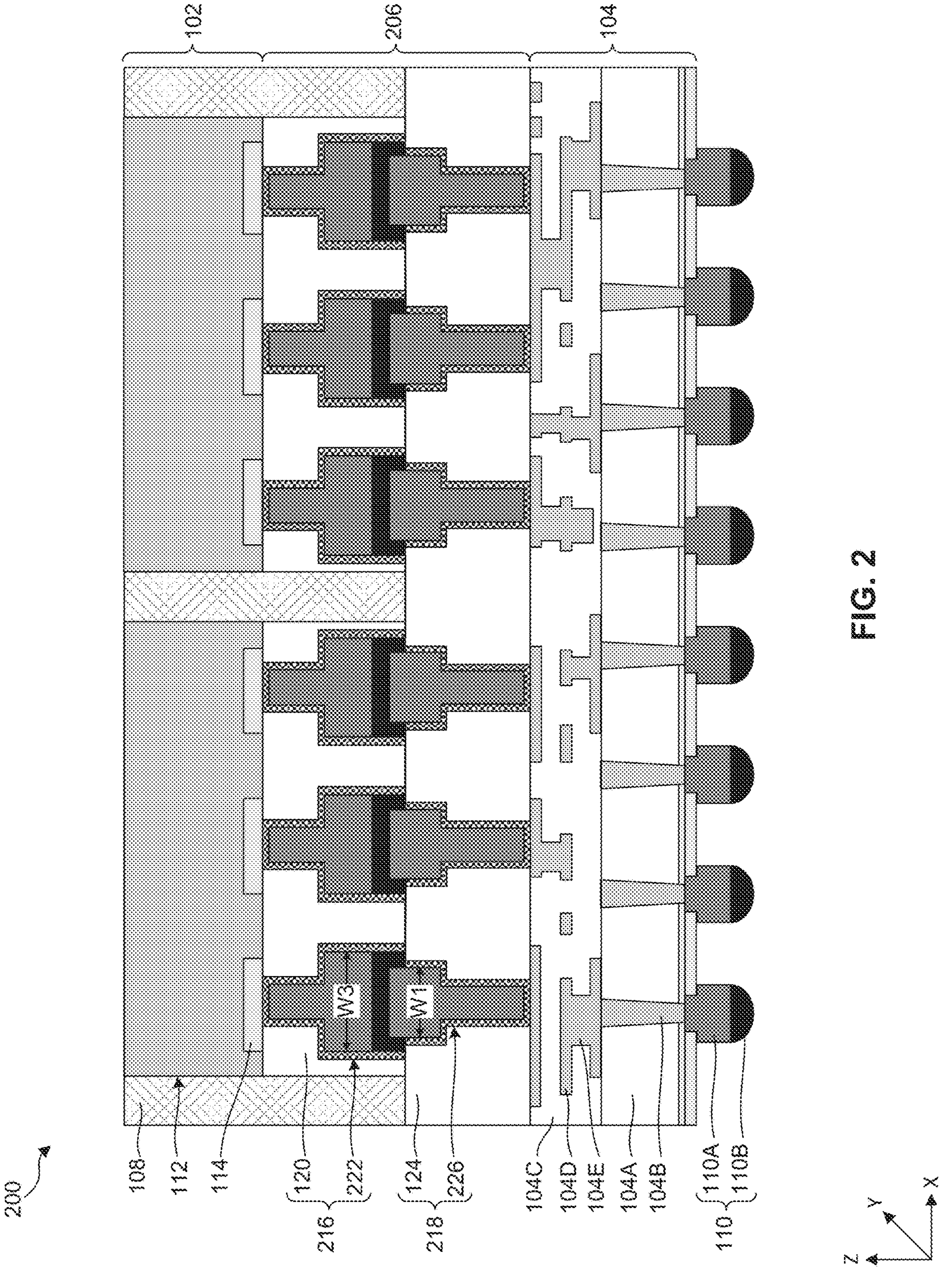
FIG. 2 illustrates a cross-sectional view of another IC die package with hybrid bonding structures, in accordance with some embodiments.

FIG. 2 illustrates a cross-sectional view of an IC die package 200, according to some embodiments. The discussion of IC die package 100 applies to IC die package 200, unless mentioned otherwise. The discussion of elements in FIGS. 1A-1E and 2 with the same annotations applies to each other, unless mentioned otherwise. In some embodiments, IC die package 200 can include (i) die layer 102, (ii) routing layer 104, (iii) a bonding layer 206, (iv) an encapsulation layer 108, and (v) conductive bonding structures 110. In some embodiments, bonding layer 206 can include one or more first hybrid bonding structures 216 and a second hybrid bonding structure 218.

A bottom surface of each first hybrid bonding structure 216 can be disposed on and electrically connected to interconnect structures 114 of a corresponding IC die 112. A top surface of each first hybrid bonding structure 216 can be disposed on and bonded to second hybrid bonding structure 218 through hybrid bonds. In some embodiments, each first hybrid bonding structure 216 can include a first dielectric layer 120 and one or more first conductive structures 222 disposed in first dielectric layer 120. In some embodiments, each first conductive structure 222 can have the same structure and composition of second conductive structure 126 described above with reference to FIGS. 1A-1E.

In some embodiments, second hybrid bonding structure 218 can include a second dielectric layer 124 and one or more second conductive structures 226 disposed in second dielectric layer 124. In some embodiments, each second conductive structure 226 can have the same structure and composition of first conductive structure 122 described above with reference to FIGS. 1A-1E.

Figure 3:
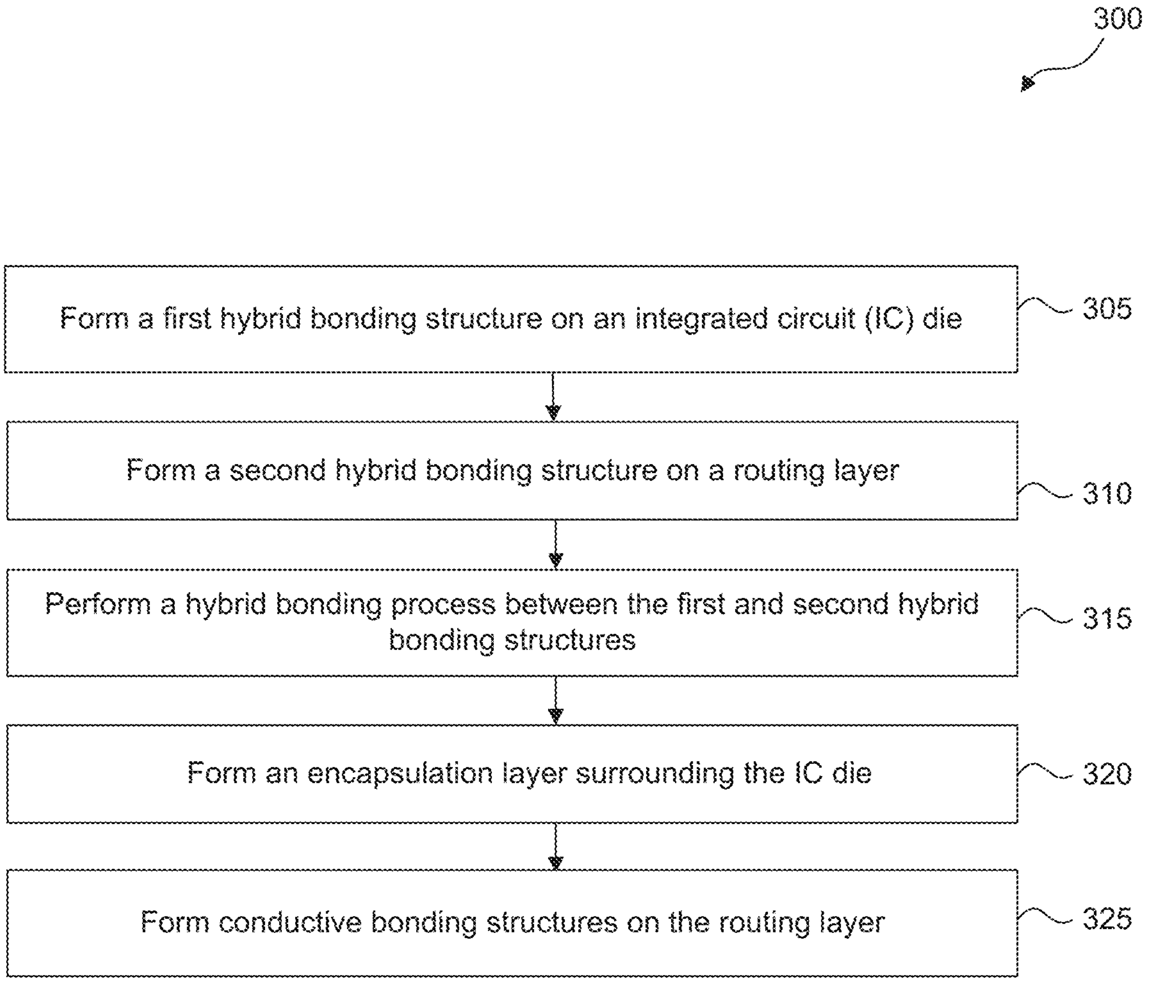
FIG. 3 is a flow diagram of a method for fabricating an IC die package with hybrid bonding structures, in accordance with some embodiments.

FIG. 3 is a flow diagram of an example method 300 for fabricating IC die package 100 shown in FIGS. 1A and 1B, according to some embodiments. For illustrative purposes, the operations illustrated in FIG. 3 will be described with reference to the example fabrication process for fabricating IC die package 100 as illustrated in FIGS. 4-15. FIGS. 4-15 are cross-sectional views of IC die package 100 at various stages of fabrication, according to some embodiments. Operations can be performed in a different order or not performed depending on specific applications. It should be noted that method 300 may not produce a complete IC die package 100. Accordingly, it is understood that additional processes can be provided before, during, and after method 300, and that some other processes may only be briefly described herein. The discussion of elements in FIGS. 1A-1E and 4-15 with the same annotations applies to each other, unless mentioned otherwise.

Figure 7:
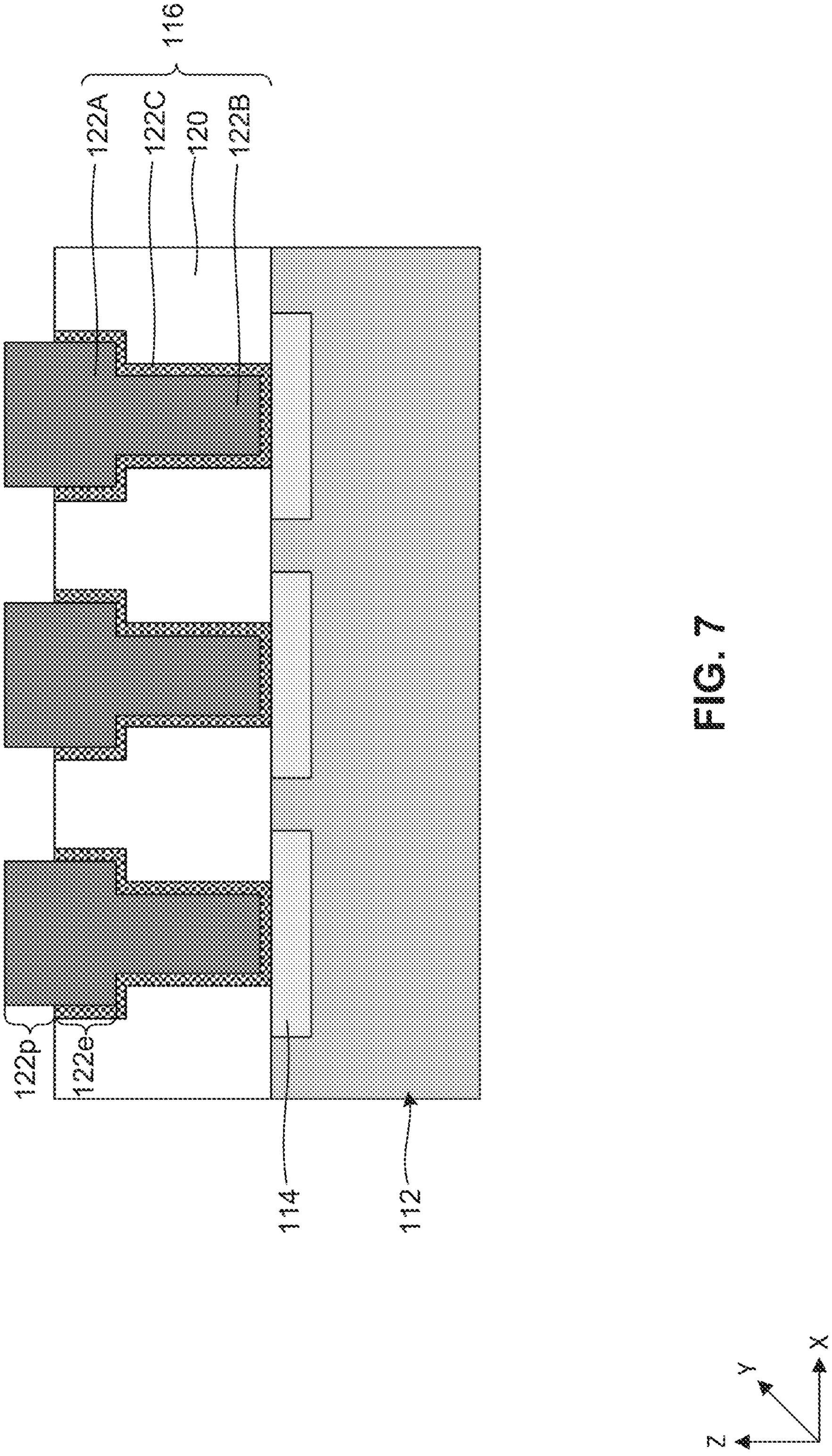

Referring to FIG. 3, in operation 305, a first hybrid bonding structure is formed on an IC die. For example, as described with reference to FIGS. 4-7, first hybrid bonding structure 116 is formed on IC die 112. In some embodiments, the formation of first hybrid bonding structure 116 can include sequential operations of (i) depositing first dielectric layer 120 on IC die 112, as shown in FIG. 4, (ii) etching first dielectric layer 120 to form pad openings 422A and via openings 422B on interconnect structures 114, as shown in FIG. 4, (iii) depositing a conductive layer 522 having the material of first liner 122C on top surfaces of dielectric layer 120 and along sidewalls of pad openings 422A and via openings 422B, as shown in FIG. 5, (iv) forming a patterned photoresist layer 538 on conductive layer 522, as shown in FIG. 5, (v) depositing a conductive material, using an electroplating process or other suitable conductive material deposition process, to fill pad openings 422A and via openings 422B and extend a distance D3 of about 500 nm to about 2000 nm over top surfaces 120*t* of first dielectric layer 120 to form first pads 122A and first vias 122B, as shown in FIG. 6, (vi) removing patterned photoresist layer 538, as shown in FIG. 7, and (vii) performing a chemical mechanical polishing (CMP) process to remove portions of conductive layer 522 not covered by first pads 122A and first vias 122B to form first liner 122C, as shown in FIG. 7. The duration for forming first hybrid bonding structure 116 can be shorter compared to that of other hybrid bonding structures as top surfaces of first pads 122A and first dielectric layer 120 are not coplanarized. Thus, with the use of anchor portions 122*p* in hybrid bonding structure 116, the manufacturing cost of IC die package 100 can be reduced. In some embodiments, operations (iii) and (vii) can be omitted to form first hybrid bonding structure 116 without first liner 122C as shown in FIG. 1E.

Figure 8:
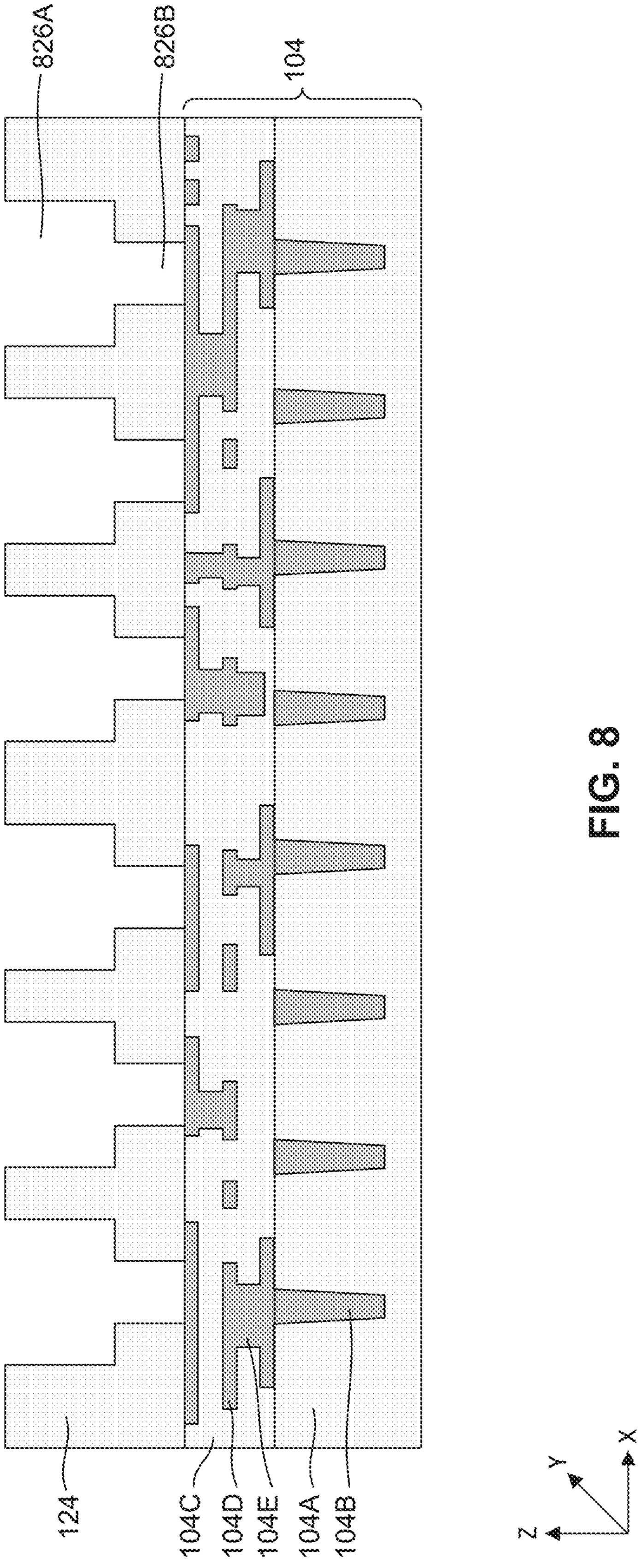
Figure 9:
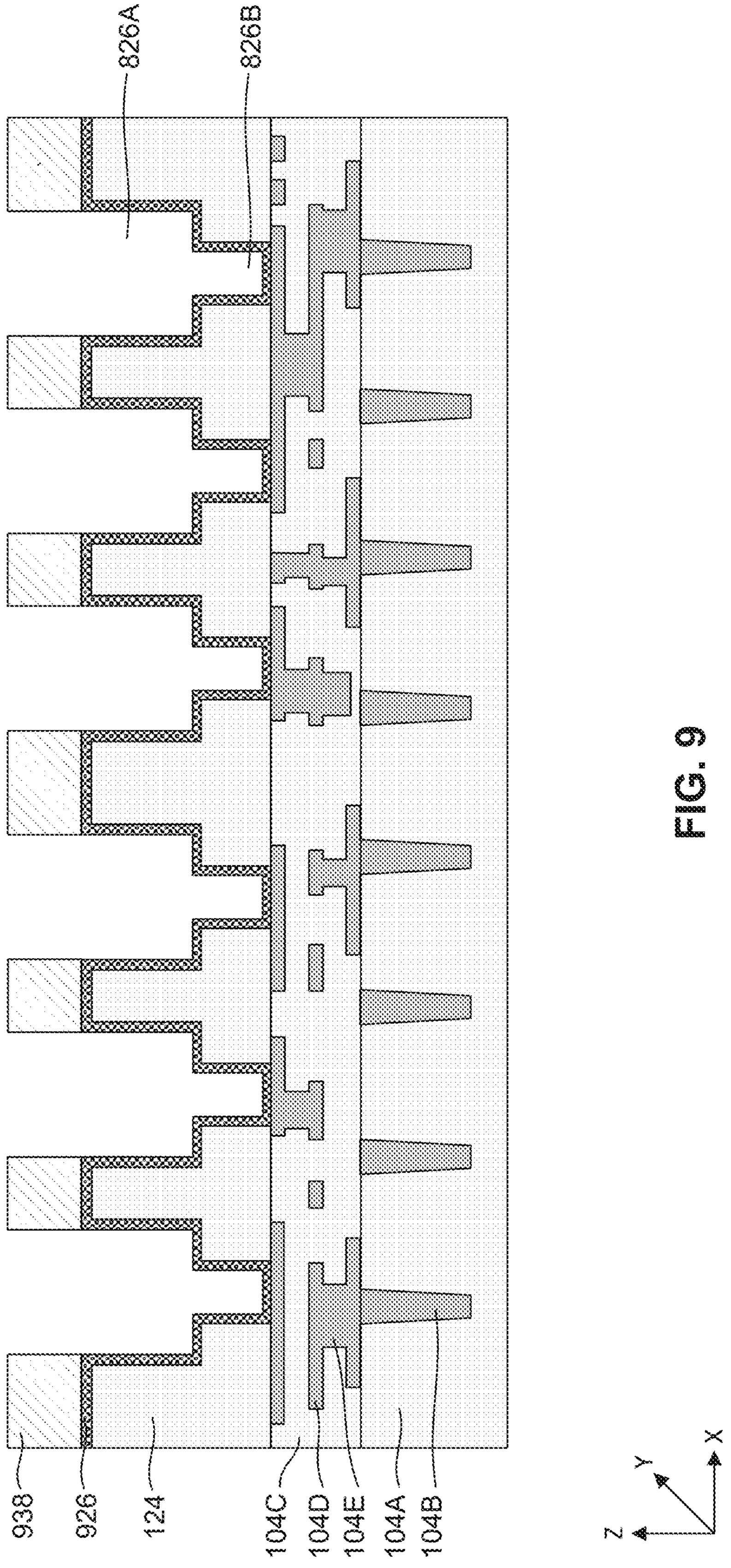
Figure 10:
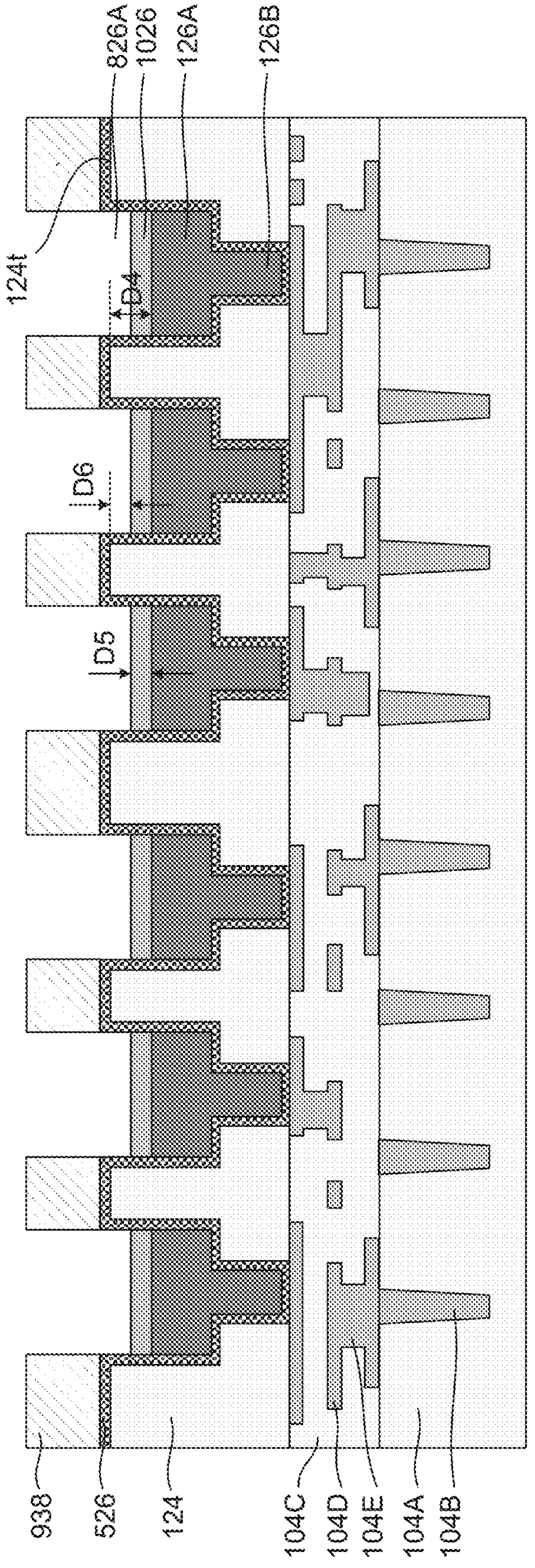
Figure 11:
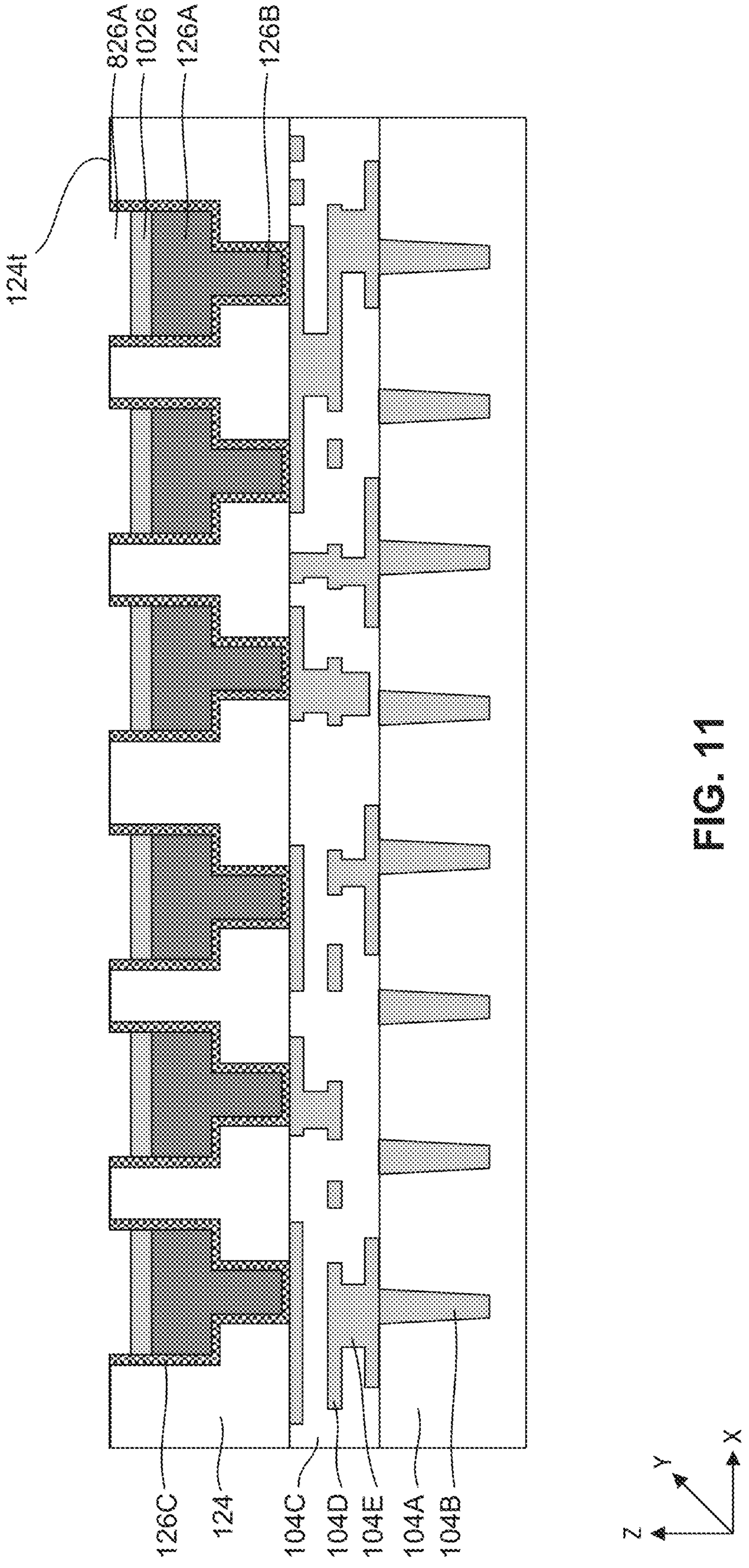

Referring to FIG. 3, in operation 310, a second hybrid bonding structure is formed on a routing layer. For example, as described with reference to FIGS. 8-11, second hybrid bonding structure 118 is formed on routing layer 104. In some embodiments, the formation of second hybrid bonding structure 118 can include sequential operations of (i) depositing second dielectric layer 124 on routing layer 104, as shown in FIG. 8, (ii) etching second dielectric layer 124 to form pad openings 826A and via openings 826B on metal lines 104D, as shown in FIG. 8, (iii) depositing a conductive layer 926 having the material of second liner 126C on top surfaces of second dielectric layer 124 and along sidewalls of pad openings 826A and via openings 826B, as shown in FIG. 9, (iv) forming a patterned photoresist layer 938 on conductive layer 926, as shown in FIG. 9, (v) depositing the conductive material of second pads 126A and second vias 126B, using an electroplating process or other suitable conductive material deposition process, in pad openings 826A and via openings 826B, as shown in FIG. 10, (vi) depositing a conductive layer 1026 having the material of metal layer 126D1 of anchor layer 126D, using an electroplating process or other suitable conductive material deposition process, on second pads 126A, as shown in FIG. 10, (vii) removing patterned photoresist layer 938, as shown in FIG. 11, and (viii) performing CMP process to remove portions of conductive layer 1026 on top surfaces 124*t* of second dielectric layer 124 to form second liner 126C, as shown in FIG. 11.

In some embodiments, the conductive material of second pads 126A can be deposited to fill pad openings 826A up to a distance D4 of about 1 μm to about 2 μm below top surfaces 124*t* of second dielectric layer 124. In some embodiments, conductive layer 1026 can be deposited with a thickness D5 of about 0.5 μm to about 1.5 μm and to fill pad openings 826A on second pads 126A up to a distance D6 of about 50 nm to about 200 nm below top surfaces 124*t* of second dielectric layer 124. In some embodiments, operations (iii) and (viii) can be omitted to form second hybrid bonding structure 118 without second liner 126C as shown in FIG. 1E. In some embodiments, operation 310 can be formed prior to operation 305 and operation 315 can follow operation 305.

Referring to FIG. 3, in operation 315, a hybrid bonding process is performed between the first and second hybrid bonding structures. For example, as described with reference to FIGS. 12-13, a hybrid bonding process is performed between first and second hybrid bonding structures 116 and 118. In some embodiments, performing the hybrid bonding process can include sequential operations of (i) performing an activation process with a plasma (e.g., hydrogen plasma) on top surfaces of first pads 122A, conductive layer 1026, first dielectric layer 120, and second dielectric layer 124, (ii) aligning anchor portions 122*p* of first hybrid bonding structure 116 with corresponding pad openings 826A in second hybrid bonding structure 118 and bringing top surfaces 120*t* of first dielectric layer 120 in contact with top surfaces 124*t* of second dielectric layer 124, as shown in FIG. 12, and (iii) performing an anneal process on the structure of FIG. 12 at a melting temperature or a liquid phase temperature of the material of conductive layer 1026 to form the structure of FIG. 13.

Figure 12:
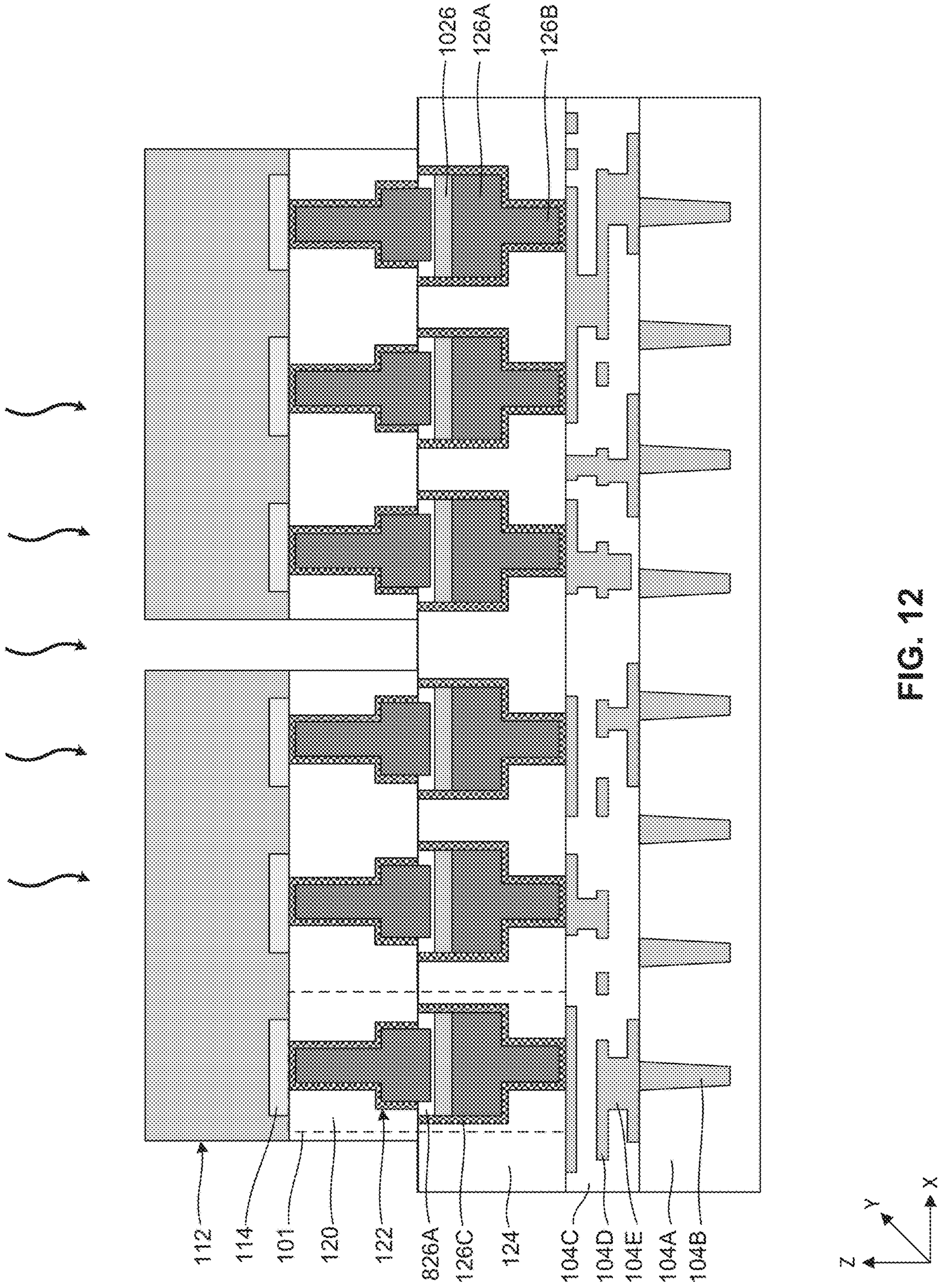
Figure 13:
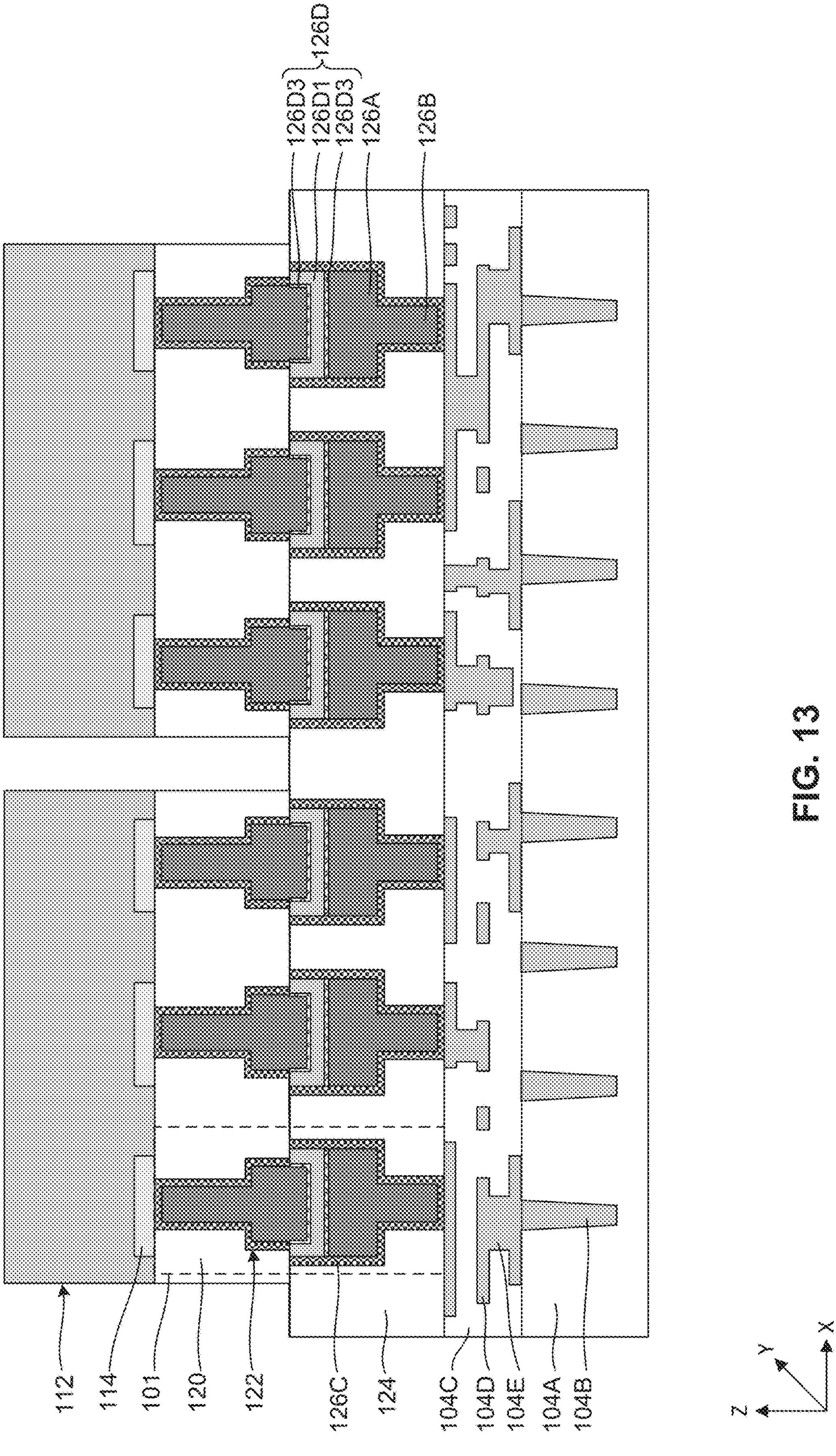

In some embodiments, anchor portions 122*p* may be not be in contact with conductive layers 1026 after the aligning in operation (ii) and there may be air gaps present between anchor portions 122*p* and conductive layers 1026, as shown in FIG. 12. In some embodiments, anchor portions 122*p* can expand and make contact with conductive layers 1026 during the anneal process. Conductive layers 1026 can melt and expand during the anneal process to fill the air gaps surrounding anchor portions 122*p* and form metal layers 126D1 and first and second IMC layers 126D2 and 126D3, as shown in FIG. 13. Portions of melted and expanded conductive layers 1026 can diffuse and react with the material of first pads 122A to form first IMC layers 126D2. Similarly, portions of melted and expanded conductive layers 1026 can diffuse with the material of second pads 126A to form second IMC layers 126D3. In some embodiments, the undiffused portions of conductive layers 1026 can form metal layers 126D1. In some embodiments, when all portions of conductive layers 1026 diffuse with the materials of first and second pads 122A and 126A, anchor layers 130 (as shown in FIG. 1D) can be formed instead of anchor layers 126D. The bonding formed between anchor layers 126D (or anchor layers 130) and first and second pads 122A and 126A can be referred to as transient liquid phase bonding.

With the use of anchor layers 126D (or anchor layers 130) to bond first and second pads 122A and 126A, the anneal process can be performed at the melting temperature of the material (e.g., Sn or In) of conductive layer 1026, which is lower than the melting temperature of the material (e.g., Cu)

of first and second pads 122A and 126A. In some embodiments, the anneal process can be performed at a temperature below about 200° C. (e.g., at a temperature of about 150° C. to about 180° C.) when conductive layer 1026 includes Sn or In.

Figure 14:
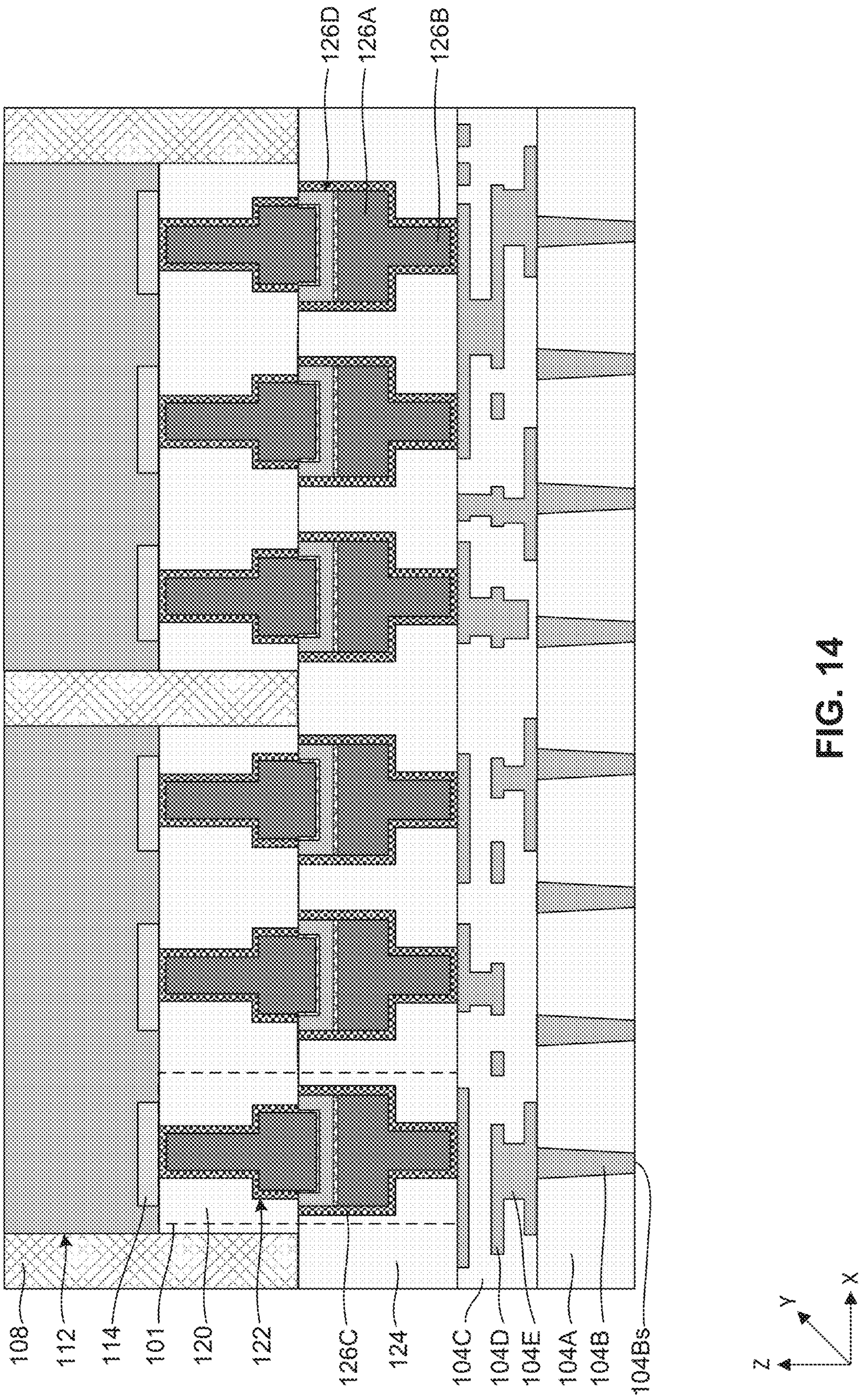

Referring to FIG. 3, in operation 320, a molding layer is formed surrounding the IC die. For example, as shown in FIG. 14, encapsulation layer 108 is formed surrounding IC dies 112. In some embodiments, encapsulation layer 108 can be formed using a compression molding or a transfer molding process.

Figure 15:
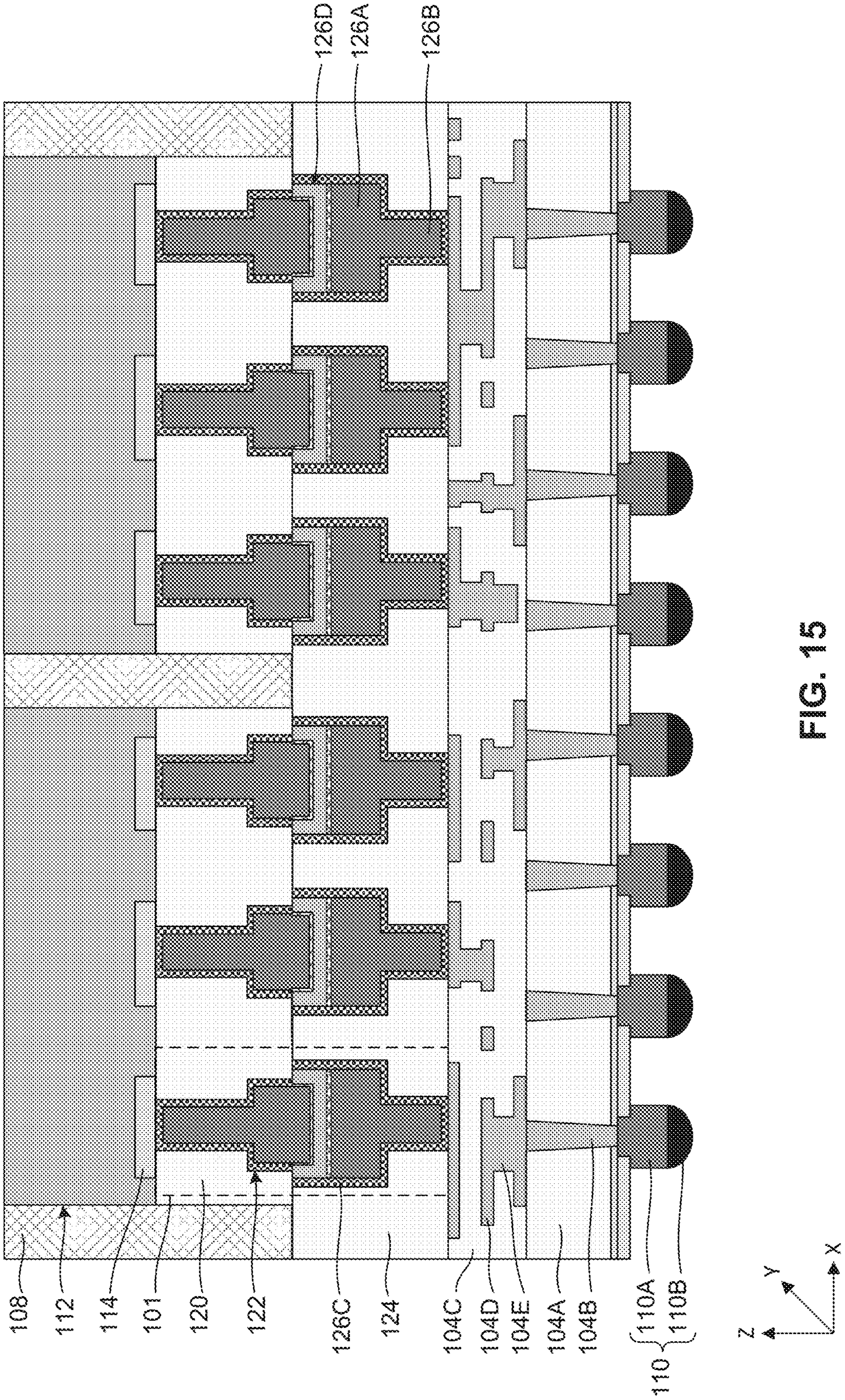

Referring to FIG. 3, in operation 325, conductive bonding structures are formed on the routing layer. For example, as described with reference to FIGS. 14 and 15, conductive bonding structures 110 are formed on routing layer 104. In some embodiments, the formation of conductive structures can include sequential operations of (i) performing a CMP process or an etching process on semiconductor substrate 104A to expose bottom surfaces 104Bs of conductive through-vias 104B, as shown in FIG. 14, and (ii) forming conductive bonding structures 110 on bottom surfaces 104Bs, as shown in FIG. 15.

Figure 16:
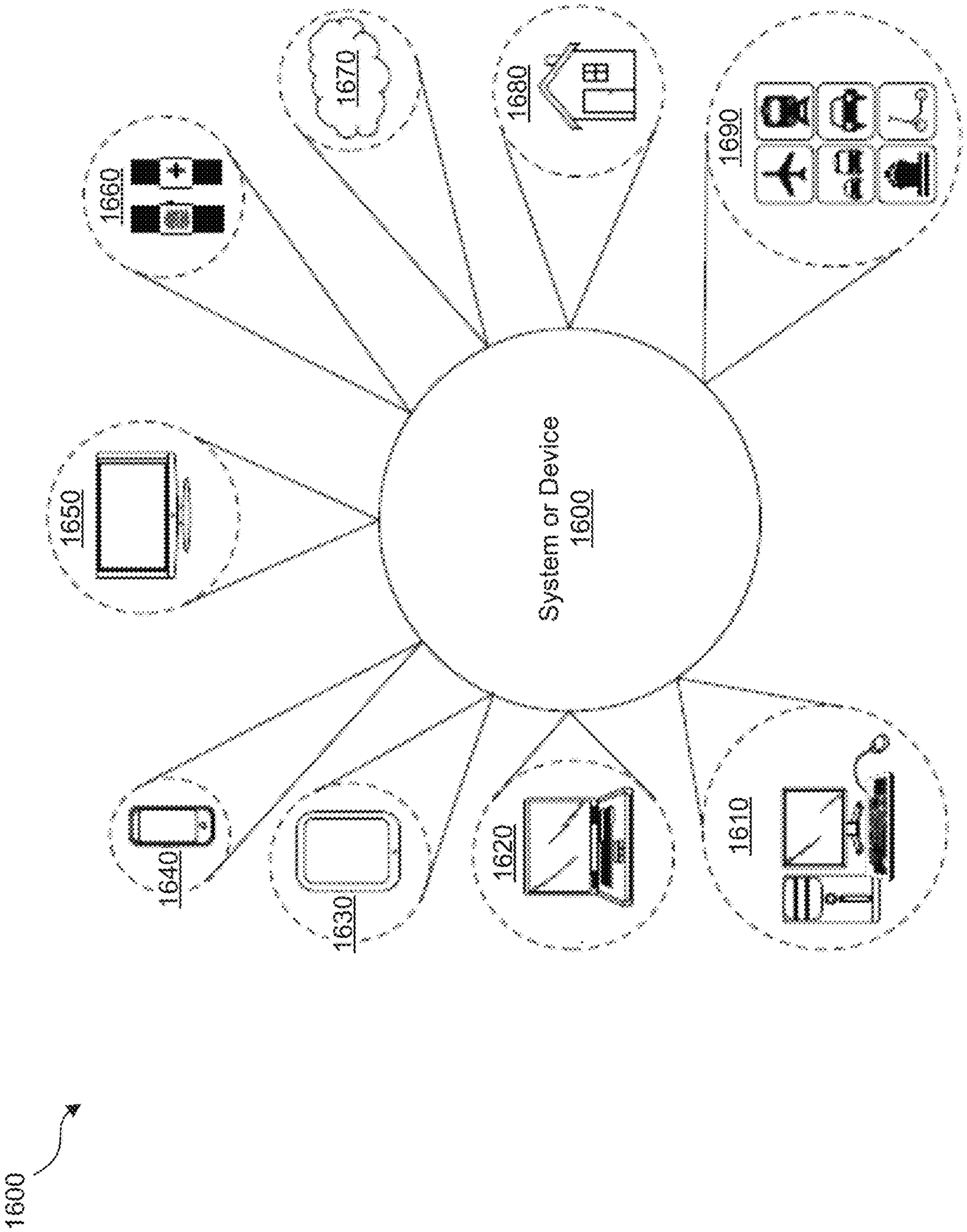
FIG. 16 illustrates exemplary systems or devices that can include the different IC die packages with the different hybrid bonding structures, in accordance with some embodiments.

FIG. 16 is an illustration of exemplary systems or devices that can include the disclosed embodiments. System or device 1600 can incorporate one or more of the disclosed embodiments in a wide range of areas. For example, system or device 1600 can be implemented in one or more of a desktop computer 1610, a laptop computer 1620, a tablet computer 1630, a cellular or mobile phone 1640, and a television 1650 (or a set-top box in communication with a television).

Also, system or device 1600 can be implemented in a wearable device 1660, such as a smartwatch or a health-monitoring device. In some embodiments, the smartwatch can have different functions, such as access to email, cellular service, and calendar functions. Wearable device 1660 can also perform health-monitoring functions, such as monitoring a user's vital signs and performing epidemiological functions (e.g., contact tracing and providing communication to an emergency medical service). Wearable device 1660 can be worn on a user's neck, implantable in user's body, glasses or a helmet designed to provide computer-generated reality experiences (e.g., augmented and/or virtual reality), any other suitable wearable device, and combinations thereof.

Further, system or device 1600 can be implemented in a server computer system, such as a dedicated server or on shared hardware that implements a cloud-based service 1670. System or device 1600 can be implemented in other electronic devices, such as a home electronic device 1680 that includes a refrigerator, a thermostat, a security camera, and other suitable home electronic devices. The interconnection of such devices can be referred to as the "Internet of Things" (IoT). System or device 1600 can also be implemented in various modes of transportation 1690, such as part of a vehicle's control system, guidance system, and/or entertainment system. The systems and devices illustrated in FIG. 16 are merely examples and are not intended to limit future applications of the disclosed embodiments. Other example systems and devices that can implement the disclosed embodiments include portable gaming devices, music players, data storage devices, and unmanned aerial vehicles.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
- an integrated circuit (IC) die;
- an interposer structure electrically connected to the IC die;
- a first bonding structure, comprising:
  - a first dielectric layer disposed on the IC die; and
  - a first conductive pad comprising an embedded portion disposed in the first dielectric layer and an anchor portion extending over a top surface of the first dielectric layer; and
- a second bonding structure bonded to the first bonding structure, wherein the second bonding structure comprises:
  - a second dielectric layer disposed on the interposer structure;
  - a second conductive pad disposed in the second dielectric layer; and
  - an anchor layer surrounding the anchor portion.

2. The structure of claim 1, wherein the first bonding structure further comprises a liner surrounding the embedded portion, and
- wherein the anchor portion is liner-free.

3. The structure of claim 1, wherein the second bonding structure further comprises a liner surrounding the second conductive pad and the anchor layer.

4. The structure of claim 1, wherein the anchor layer comprises:
- a metal layer comprising a first melting temperature lower than a second melting temperature of the first conductive pad; and
- an intermetallic compound layer.

5. The structure of claim 1, wherein the anchor layer comprises:
- a metal layer comprising a first metal; and
- an intermetallic compound layer comprising the first metal and a metal of the first conductive pad.

6. The structure of claim 1, wherein the anchor layer comprises:
- a metal layer comprising a first metal;
- a first intermetallic compound layer disposed between the metal layer and the first conductive pad; and a second intermetallic compound layer disposed between the metal layer and the second conductive pad.

7. The structure of claim 6, wherein the first intermetallic compound layer comprises the first metal and a metal of the first conductive pad; and the second intermetallic compound layer comprises the first metal and a metal of the second conductive pad.

8. The structure of claim 1, wherein the first and second conductive pads comprise a first metal; and wherein the anchor layer comprises an intermetallic compound layer comprising the first metal and a second metal different from the first metal.

9. The structure of claim 1, wherein the anchor layer is disposed directly on a top surface and sidewalls of the anchor portion.

10. The structure of claim 1, wherein a width of the first conductive pad is smaller than a width of the second conductive pad.

11. An integrated circuit (IC) die package, comprising:

a routing layer comprising conductive lines and vias;

a die layer comprising IC dies disposed on the routing layer; and a bonding layer disposed between the routing layer and the die layer, wherein the bonding layer comprises:

a bottom dielectric layer disposed on the routing layer;

a top dielectric layer disposed on and bonded to the bottom dielectric layer;

a bottom conductive structure disposed in the bottom dielectric layer; and a top conductive structure comprising a first portion disposed in the top dielectric layer and a second portion disposed in the bottom conductive structure.

12. The IC die package of claim 11, wherein the bottom conductive structure comprises:

a first conductive layer comprising copper; and a second conductive layer comprising an alloy of copper and tin.

13. The IC die package of claim 11, wherein the bottom conductive structure comprises:

a first conductive layer comprising tin; and a second conductive layer comprising an alloy of copper and tin.

14. The IC die package of claim 11, wherein the second portion of the top conductive structure is surrounded by a metal alloy layer of the bottom conductive structure.

15. The IC die package of claim 11, wherein a width of the top conductive structure is smaller than a width of the bottom conductive structure.

16. The IC die package of claim 11, wherein the first portion of the top conductive structure is surrounded by a conductive liner and the second portion of the top conductive structure is liner-free.

17. A method, comprising:

forming a first opening in a first dielectric layer on an integrated circuit (IC) die;

depositing a first conductive layer with a first layer portion in the first opening and a second layer portion extending over a top surface of the first dielectric layer;

forming a second opening in a second dielectric layer on an interposer structure;

depositing a second conductive layer in the second opening;

depositing a third conductive layer on the second conductive layer, wherein a top surface of the third conductive layer is below a top surface of the second dielectric layer;

placing the top surface of the first dielectric layer on the top surface of the second dielectric layer to position the second layer portion in the second opening and on the third conductive layer; and performing a bonding process to bond the second layer portion and the third conductive layer.

18. The method of claim 17, wherein performing the bonding process comprises performing an anneal process at a melting temperature of the third conductive layer.

19. The method of claim 17, wherein performing the bonding process comprises performing an anneal process at a temperature lower than a melting temperature of the first and second conductive layers.

20. The method of claim 17, further comprising depositing a liner in the first opening prior to depositing the first conductive layer.

* * * * *